United States Patent
Matsuda et al.

(10) Patent No.: US 9,893,246 B2
(45) Date of Patent: Feb. 13, 2018

(54) LIGHTING DEVICE

(71) Applicant: LG INNOTEK CO., LTD., Seoul (KR)

(72) Inventors: Shuhei Matsuda, Seoul (KR); Tomohiro Sampei, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 109 days.

(21) Appl. No.: 14/708,397

(22) Filed: May 11, 2015

(65) Prior Publication Data

US 2015/0325757 A1    Nov. 12, 2015

(30) Foreign Application Priority Data

May 12, 2014    (KR) .................. 10-2014-0056207

(51) Int. Cl.
*H01L 33/50*    (2010.01)
*H01L 33/56*    (2010.01)

(52) U.S. Cl.
CPC .......... *H01L 33/505* (2013.01); *H01L 33/508* (2013.01); *H01L 33/56* (2013.01); *H01L 2224/48091* (2013.01); *H01L 2224/73265* (2013.01); *H01L 2924/181* (2013.01)

(58) Field of Classification Search
CPC .................. H01L 2924/181; H01L 33/505
See application file for complete search history.

(56) References Cited

U.S. PATENT DOCUMENTS

| | | |
|---|---|---|
| 2010/0149816 A1 | 6/2010 | Higashi et al. |
| 2012/0140506 A1 | 6/2012 | Waragawa et al. |
| 2014/0048827 A1* | 2/2014 | Inoue ...................... H01L 33/08 257/88 |
| 2014/0070243 A1* | 3/2014 | Kim ...................... H01L 33/0095 257/89 |
| 2014/0110736 A1* | 4/2014 | Waragaya ............. H01L 33/505 257/98 |

FOREIGN PATENT DOCUMENTS

| | | |
|---|---|---|
| EP | 2 479 812 A2 | 7/2012 |
| EP | 2 511 965 A2 | 10/2012 |
| EP | 2 555 262 A2 | 2/2013 |
| JP | 2010-219324 A | 9/2010 |

OTHER PUBLICATIONS

European Search Report dated Sep. 14, 2015 issued in Application No. 15166955.3.

* cited by examiner

*Primary Examiner* — Thao X Le
*Assistant Examiner* — Xia Cross
(74) *Attorney, Agent, or Firm* — KED & Associates, LLP

(57) ABSTRACT

A lighting may include a substrate, a light emitting device disposed on the substrate, a wavelength conversion layer which is disposed on the light emitting device and converts a part of first light emitted from the light emitting device into second light having a wavelength different from that of the first light, and a resin which is disposed on the substrate and buries the light emitting device and at least a portion of the wavelength conversion layer. An area of the top surface of the wavelength conversion layer is greater than that of the bottom surface of the wavelength conversion layer. The side surface of the wavelength conversion layer is inclined at a predetermined angle with respect to the top surface or the bottom surface.

17 Claims, 6 Drawing Sheets

(a)

(b)

(c)

LIGHTING DEVICE

CROSS-REFERENCE TO RELATED APPLICATION

This application claims priority under 35 U.S.C. § 119 to Korean Application No. 10-2014-0056207 filed May 12, 2014, whose entire disclosure is hereby incorporated by reference.

BACKGROUND

1. Field

Embodiments may relate to a lighting device.

2. Background

A light emitting diode (LED) is an energy device for converting electric energy into light energy. Compared with an electric bulb, the LED has higher conversion efficiency, lower power consumption and a longer life span. As there advantages are widely known, more attentions are now paid to a lighting apparatus using the LED.

The lighting apparatus using the LED are generally classified into a direct lighting apparatus and an indirect lighting apparatus. The direct lighting apparatus emits light emitted from the LED without changing the path of the light. The indirect lighting apparatus emits light emitted from the LED by changing the path of the light through reflecting means and so on. Compared with the direct lighting apparatus, the indirect lighting apparatus mitigates to some degree the intensified light emitted from the LED and protects the eyes of users.

A background lighting device using the light emitting diode includes a lighting device which uses a wavelength conversion layer on the light emitting surface of the light emitting diode.

The lighting device includes a white resin around the wavelength conversion layer. In this case, the white resin moves on the top surface of the wavelength conversion layer, so that the wavelength conversion layer is contaminated or stained by the white resin.

BRIEF DESCRIPTION OF THE DRAWINGS

The embodiments will be described in detail with reference to the following drawings in which like reference numerals refer to like elements wherein.

DETAILED DESCRIPTION

First Embodiment

Figure 1:
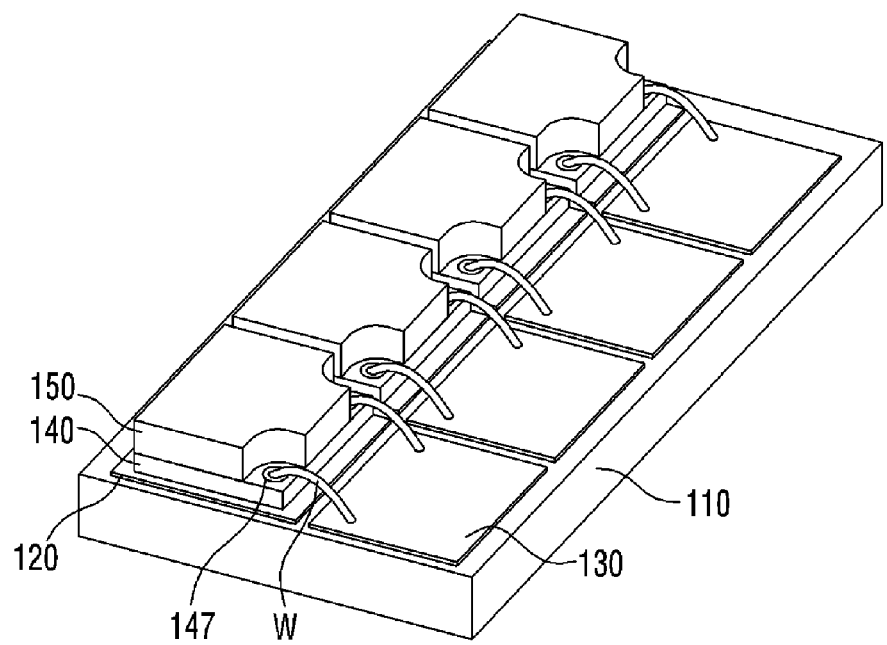
FIG. 1 is a perspective view of a lighting device according to a first embodiment.
Figure 2:
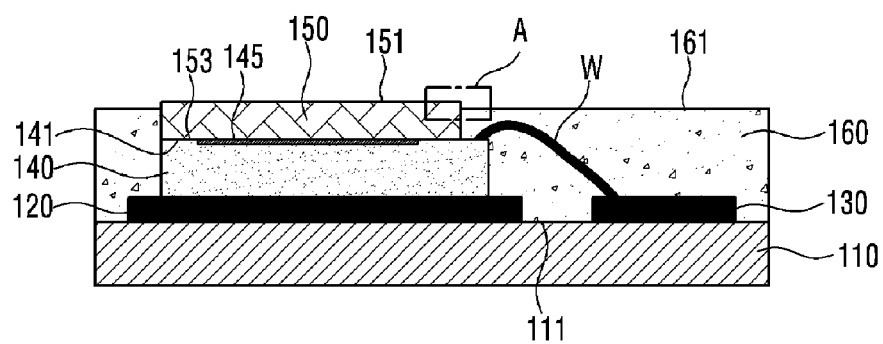
FIG. 2 is a cross-sectional side view of the lighting device of FIG. 1.
Figure 3:
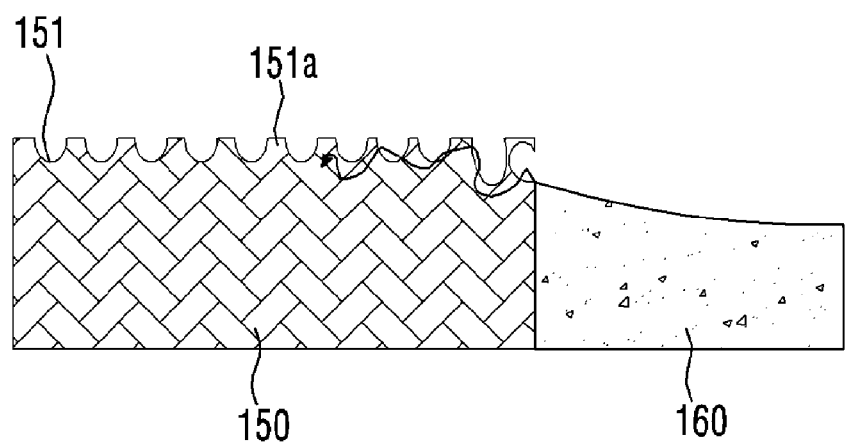
FIG. 3 is an enlarged view of a part "A" shown in FIG. 2.

FIG. 1 is a perspective view of a lighting device according to a first embodiment. FIG. 2 is a cross-sectional side view of the lighting device of FIG. 1. FIG. 3 is an enlarged view of a part "A" shown in FIG. 2. Here, FIG. 1 is a perspective view showing the lighting device without a resin 160 shown in FIG. 2. The lighting device may include a substrate 110, a first electrode layer 120, a second electrode layer 130, a light emitting device 140, a wavelength conversion layer 150 and the resin 160. The first electrode layer 120, the second electrode layer 130, the light emitting device 140, the wavelength conversion layer 150 and the resin 160 may be disposed on the substrate 110.

The substrate 110 functions as a body. A printed circuit board (PCB), silicon wafer, resin, and sub-mount may be variously used as the substrate 110. Also, depending on the material of the substrate 110, the substrate 110 may be divided into a plastic package, a ceramic package, a metal package, etc.

An insulation layer may be disposed on the substrate 110. The insulation layer functions to isolate the electrical connections between other components. However, when the substrate 110 is made of a nonconductive material, the insulation layer is not necessarily disposed.

The first electrode layer 120 and the second electrode layer 130 are disposed on the top surface 111 of the substrate 110. The first electrode layer 120 and the second electrode layer 130 are disposed separately from each other on the top surface 111 of the substrate 110. Therefore, the first electrode layer 120 and the second electrode layer 130 are electrically isolated from each other. The first electrode layer 120 and the second electrode layer 130 are made of a conductive material and are electrically connected to the light emitting device 140.

The light emitting device 140 is disposed on the first electrode layer 120. The first electrode layer 120 is electrically connected to any one of two electrodes of the light emitting device 140. The light emitting device 140 may be disposed on the substrate 110 and may be disposed on the top surface of the first electrode layer 120.

The light emitting device 140 may include a light emitting structure including a first conductive semiconductor layer, an active layer, and a second conductive semiconductor layer. For example, the light emitting structure may be provided to have a structure in which the active layer is disposed between the first conductive semiconductor layer and the second conductive semiconductor layer.

The first conductive semiconductor layer may include an n-type semiconductor layer and may be made of a material selected from GaN, AlN, AlGaN, InGaN, InN, InAlGaN, AlInN, AlGaAs, GaP, GaAs, GaAsP, AlGaInP and the like. The first conductive semiconductor layer may be doped with n-type dopant like Si, Ge, Sn, Se, Te, etc.

The active layer is a layer in which electrons (or electron holes) injected through the first conductive semiconductor layer encounter electron holes (or electrons) injected through the second conductive semiconductor layer. The active layer emits light due to the energy band gap difference according to the constituent material thereof. The active layer may be formed to have at least any one of a single well structure, a multiple well structure, a quantum dot structure, and a quantum wire structure. However, there is no limit to this.

The second conductive semiconductor layer may be implemented by a p-type semiconductor layer and may be made of a material selected from GaN, AlN, AlGaN, InGaN, InN, InAlGaN, AlInN, AlGaAs, GaP, GaAs, GaAsP, AlGaInP and the like. The second conductive semiconductor layer may be doped with p-type dopant like Mg, Zn, Ca, Sr, Ba, etc.

Meanwhile, the first conductive semiconductor layer may include the p-type semiconductor layer, and the second conductive semiconductor layer may include the n-type semiconductor layer. Also, a semiconductor layer including the n-type or p-type semiconductor layer may be formed under the second conductive semiconductor layer. Accordingly, the light emitting structure may include at least one of an n-p junction structure, a p-n junction structure, an n-p-n junction structure, and a p-n-p junction structure.

The light emitting device 140 may selectively emit light from a visible light range to an ultraviolet range or may emit light having a unique color of a semiconductor material. One or more light emitting devices 140 may be disposed on the top surface of the first electrode layer 120. The light emitting device 140 may be a light emitting diode chip which emits red, green, blue visible light, etc., or a light emitting diode chip which emits ultraviolet light.

The light emitting device 140 may include a first electrode and a second electrode 147. The first electrode of the light emitting device 140 is formed on the bottom surface of the light emitting device 140 and is electrically connected directly to the first electrode layer 120. The second electrode 147 is electrically connected to the second electrode layer 130 through a wire "W".

Here, as shown in FIG. 1, a plurality of second electrodes 147 of one light emitting device 140 may be provided. For example, two second electrodes 147 may be provided. Each of the two second electrodes 147 may be connected to the second electrode layer 130 through the wire. When the second electrode layer 130 is connected to the second electrode 147 of the light emitting device 140 through the plurality of wires, a luminance distribution of the entire light emitting surface is more even than that of the light emitting surface of the lighting device using one wire, and color deviation is reduced. Accordingly, the reliability of the light emitting device is improved and stain caused by the light emitting can be reduced.

The wavelength conversion layer 150 is disposed on the light emitting device 140. The light emitting device 140 may include a top surface 141 on which the wavelength conversion layer 150 is disposed.

The top surface 141 of the light emitting device 140 may include a light emitting surface 145 from which the light is actually emitted and a portion where the second electrode 147 which is connected to the wire "W" is disposed. The area of the light emitting surface 145 is less than the area of the top surface 141. The portion where the second electrode 147 is disposed may be a corner of the top surface 141.

The wavelength conversion layer 150 is disposed on the light emitting device 140. The wavelength conversion layer 150 may be disposed on the top surface 141 of the light emitting device 140.

The area of a bottom surface 153 of the wavelength conversion layer 150 may be less than the area of the top surface 141 of the light emitting device 140. This is because the second electrode 147 of the light emitting device 140 may be disposed on the top surface 141 of the light emitting device 140.

The area of the bottom surface 153 of the wavelength conversion layer 150 may be greater that the area of the light emitting surface 145 of the light emitting device 140. This may cause all of the light which is emitted from the light emitting surface 145 to pass through the wavelength conversion layer 150.

The wavelength conversion layer 150 converts a part of first light which is emitted from the light emitting device 140 into second light having a wavelength different from that of the first light, and emits the other part of the first light together with the converted second light. Accordingly, the wavelength conversion layer 150 emits light mixed with the first light and the second light.

The wavelength conversion layer 150 may include a fluorescent material so as to convert the first light into the second light. Here, the fluorescent material may be a phosphor. The phosphor may include at least one of a red phosphor, a green phosphor, and a yellow phosphor. The phosphor may include at least one of garnet based phosphor (YAG, TAG), a silicate based phosphor, a nitride based phosphor and an oxynitride based phosphor.

The phosphor included in the wavelength conversion layer 150 is excited by the first light emitted from the light emitting device 140, and then emits the second light having a wavelength different from that of the first light. Therefore, both the first light emitted from the light emitting device 140 and the second light excited by the first light and emitted may be emitted from a top surface 151 of the wavelength conversion layer 150. The wavelength conversion layer 150 may include a fluorescent material and a light transmitting material.

When the light transmitting material is mixed with many kinds of phosphors, an addition ratio of the color of the phosphor may be formed such that the green phosphor is more used than the red phosphor, and the yellow phosphor is more used than the green phosphor. The garnet phosphor (YAG), the silicate phosphor and the oxynitride phosphor may be used as the yellow phosphor. The silicate phosphor and the oxynitride phosphor may be used as the green phosphor. The nitride phosphor may be used as the red phosphor. The light transmitting material may be mixed with various kinds of the phosphors or may be configured by a layer including the red phosphor, a layer including the green phosphor and a layer including the yellow phosphor, which are formed separately from each other. The light transmitting material may be any one of resin, glass and ceramic.

As shown in FIG. 3, the top surface 151 of the wavelength conversion layer 150 may include a fine uneven structure 151a. The fine uneven structure 151a improves the light extraction efficiency of the wavelength conversion layer 150, so that the light extraction efficiency of the lighting device according to the first embodiment can be enhanced. The top surface 151 of the wavelength conversion layer 150 having the fine uneven structure 151a may have a surface roughness (Ra) larger than 0.1 um.

The top surface 151 of the wavelength conversion layer 150 may not have the fine uneven structure 151a. That is, the top surface 151 of the wavelength conversion layer 150 may be flat without the fine uneven structure 151a or may have an upwardly or downwardly convex curved surface. The top surface 151 of the wavelength conversion layer 150 may function as a light emitting surface of the lighting device according to the first embodiment.

The light emitting device 140 and the wavelength conversion layer 150 may be bonded to each other by means of an adhesive agent. The adhesive agent is able to prevent the light from leaking through a gap between the wavelength conversion layer 150 and the light emitting device 140. Since the light emitting device 140 and the wavelength conversion layer 150 are bonded to each other, the wavelength conversion layer 150 is able to stably guide the light of the light emitting device 140.

The adhesive agent may be made of a material having thermal resistance and light resistance, for example, silicon, fluoric resin, inorganic paste (glass). When the thermal resistance and light resistance of the adhesive agent are increased, the reliability of the lighting device is improved, so that it is possible to enhance lumen maintenance.

The resin 160 is disposed on the substrate 110. The resin 160 may be disposed to cover or bury the light emitting device 140 and a portion of the wavelength conversion layer 150. The resin 160 may cover the wire "W", the first electrode layer 120 and the second electrode layer 130. The resin 160 may have a white color. The white resin 160 may reflect incident light. Accordingly, the light extraction efficiency of the lighting device according to the first embodiment can be enhanced.

A top surface 161 of the resin 160 may be located lower than the top surface 151 of the wavelength conversion layer 150. When the top surface 161 of the resin 160 is located lower than the top surface 151 of the wavelength conversion layer 150, it is possible to prevent the liquefied resin 160 at the time of forming the resin 160 from overflowing into or being introduced into the top surface 151 of the wavelength conversion layer 150, or to reduce the introduction amount of the liquefied resin 160.

As a result, it is possible to reduce the contamination or stain, which is caused by the resin 160, on the top surface 151 of the wavelength conversion layer 150, i.e., the light emitting surface 151. The top surface 151 of the wavelength conversion layer 150 may be disposed at the same or similar height as the top surface 161 of the resin 160.

The wire "W" may be selected considering the reliability, productivity, cost, performance, etc., of the product. The wire "W" may be made of a metallic material like Au, Ag, Cu, Al and the like.

In the lighting device according to the first embodiment, when the resin 160 is formed, the top surface 161 of the resin 160 is located lower than the top surface 151 of the wavelength conversion layer 150 in order to overcome the problem that the liquefied resin 160 overflows into or is introduced into the top surface 151 of the wavelength conversion layer 150. However, the thicknesses of the wavelength conversion layer 150 and the resin 160 are actually very small. Therefore, it is difficult to control the thicknesses in the manufacture of the lighting device.

As shown in FIG. 3, when the liquefied resin 160 is formed around the wavelength conversion layer 150 in the manufacture of the resin 160, the liquefied resin 160 comes in contact with the edge of the top surface 151 of the wavelength conversion layer 150 by a surface tension. In a case where the top surface 151 of the wavelength conversion layer 150 has the fine uneven structure 151a, the liquefied resin 160 in contact with the edge of the top surface 151 of the wavelength conversion layer 150 may spread on the top surface 151 of the wavelength conversion layer 150 along the fine uneven structure 151a of the wavelength conversion layer 150 by a capillary phenomenon. A lighting device capable of solving such a problem will be described below.

Second Embodiment

Figure 4:
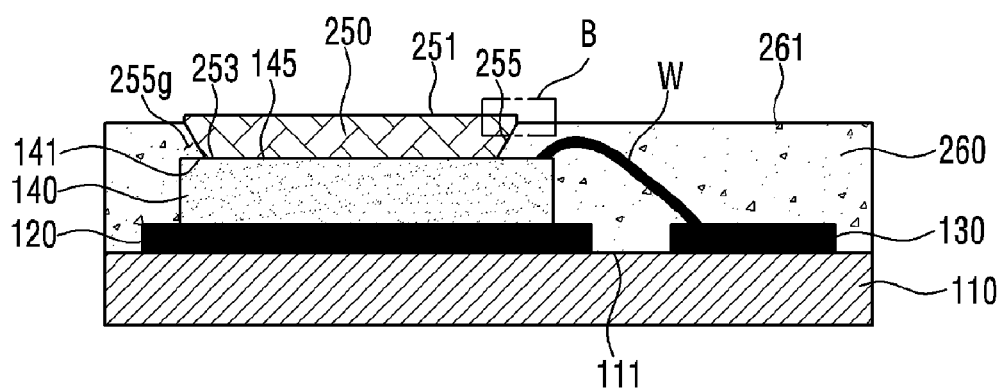
FIG. 4 is a cross-sectional side view of a lighting device according to a second embodiment.
Figure 5:
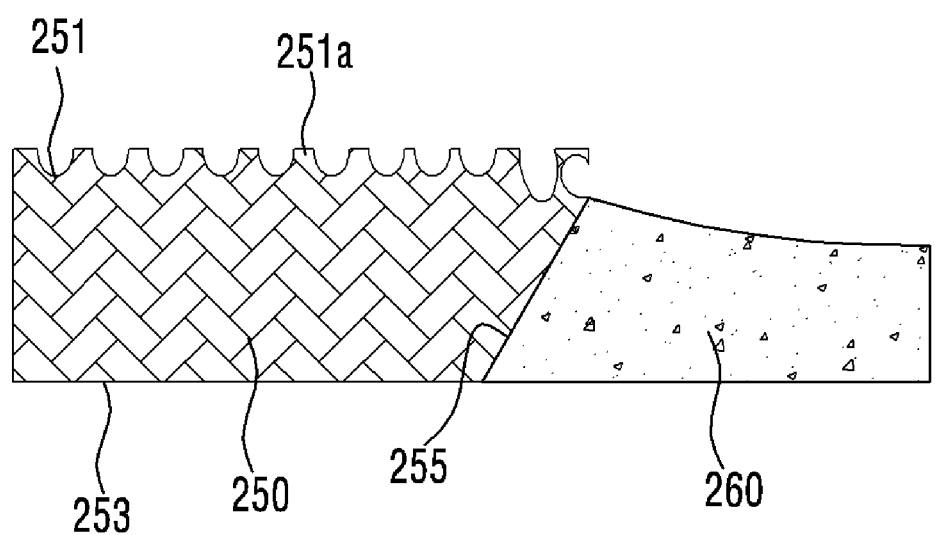
FIG. 5 is an enlarged view of a part "B" shown in FIG. 4.

FIG. 4 is a cross-sectional side view of a lighting device according to a second embodiment. FIG. 5 is an enlarged view of a part "B" shown in FIG. 4. The lighting device may include the substrate 110, the first electrode layer 120, the second electrode layer 130, the light emitting device 140, a wavelength conversion layer 250, and a resin 260.

Here, since the substrate 110, the first electrode layer 120, the second electrode layer 130, and the light emitting device 140 are the same as the substrate 110, the first electrode layer 120, the second electrode layer 130, and the light emitting device 140 shown in FIGS. 1 to 3, descriptions thereabout is replaced by the foregoing description. The wavelength conversion layer 250 and the resin 260 will be described in detail hereinafter.

The wavelength conversion layer 250 includes a top surface 251, a bottom surface 253, and a side surface 255. The side surface 255 is disposed between the top surface 251 and the bottom surface 253. A plurality of the side surfaces 255 may be provided according to the number of the sides of the top surface 251.

As shown in FIG. 5, the top surface 251 of the wavelength conversion layer 250 may include a fine uneven structure 251a. The fine uneven structure 251a is able to improve the light extraction efficiency of the wavelength conversion layer 250. The wavelength conversion layer 250 may be flat without the fine uneven structure 251a or may have an upwardly or downwardly convex portion thereof.

The top surface 251 of the wavelength conversion layer 250 may be located higher than a top surface 261 of the resin 260. When the top surface 251 of the wavelength conversion layer 250 is located higher than the top surface 261 of the resin 260, it is possible to prevent or reduce the possibility that the liquefied resin 260 at the time of forming the resin 160 overflows into or is introduced into the top surface 251 of the wavelength conversion layer 250. The top surface 251 of the wavelength conversion layer 250 may be disposed at the same or similar height as the top surface 261 of the resin 260.

The side surface 255 may include a surface inclined at a predetermined angle with respect to the top surface 251 or the bottom surface 253. For example, the side surface 255 may form a predetermined angle with the bottom surface 253. The side surface 255 will be described in detail with reference to FIG. 6.

Figure 6:
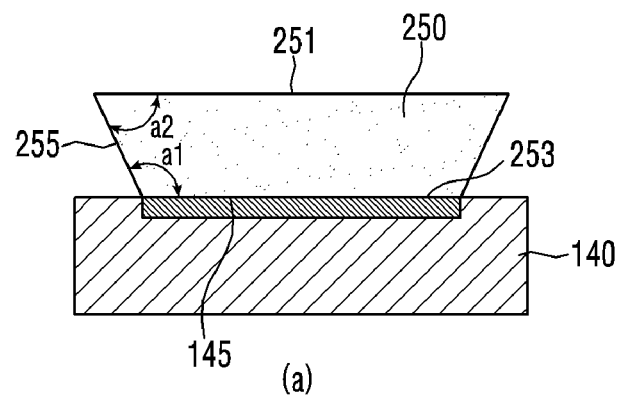
FIG. 6 is a cross sectional view showing a light emitting device 140 and a wavelength conversion layer 250 shown in FIG. 4.
Figure 6:
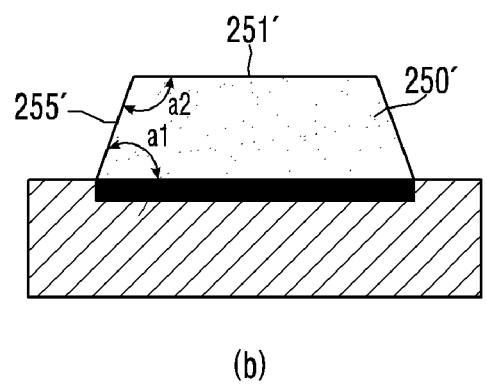
Figure 6:
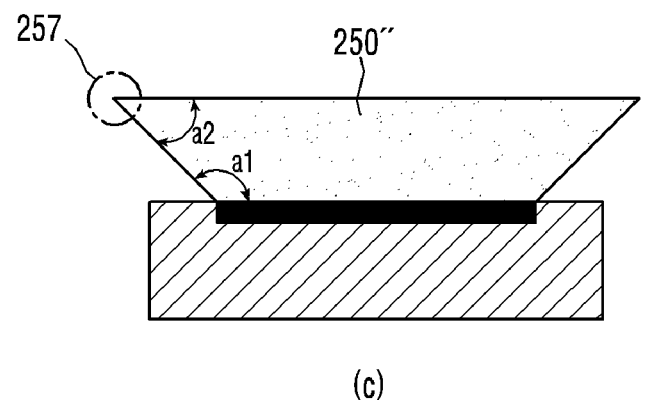

FIG. 6 is a cross sectional view showing a light emitting device 140 and a wavelength conversion layer 250 shown in FIG. 4.

Referring to (a) of FIG. 6, a first angle "a1" between the side surface 255 and the bottom surface 253 of the wavelength conversion layer 250 may be an obtuse angle, and a second angle "a2" between the side surface 255 and the top surface 251 may be an acute angle. The first angle "a1" may be an angle between the side surface 255 and the light emitting surface 145 of the light emitting device 140.

When the first angle "a1" is an acute and the second angle "a2" is an obtuse angle as shown in (b) of FIG. 6, the liquefied resin 260 shown in FIG. 4 is likely to spread on the top surface 251' along the side surface 255' of a wavelength conversion layer 250'. Therefore, it is preferable that the first angle "a1" is an obtuse and the second angle "a2" is an acute angle.

Referring back to (a) of FIG. 6, more specifically, the first angle "a1" may be from 95 degree (°) to 115 degree (°), and the second angle "a2" may be from 65 degree (°) to 85 degree (°).

When the first angle "a1" is less than 95 degree (°) and the second angle "a2" is greater than 85 degree (°), the liquefied resin 260 shown in FIG. 4 may spread on the top surface 251 along the side surface 255 of the wavelength conversion layer 250 due to the surface tension by the liquefied resin 160 shown in FIG. 3 or due to the capillary phenomenon by the fine uneven structure 151a shown in FIG. 3.

Meanwhile, when the first angle "a1" is greater than 115 degree (°) and the second angle "a2" is less than 65 degree (°), an edge 257 of the upper portion of a wavelength conversion layer 250" becomes thinner and sharper as shown in (c) of FIG. 6, and thus, is fragile by an external impact.

The area of the top surface 251 may be greater than the area of the bottom surface 253. At least one of the plurality of side surfaces 255 disposed between the top surface 251 and bottom surface 253 may be a surface inclined toward the top surface 141 of the light emitting device 140 or the top surface of the substrate 110. As such, in the case where the area of the top surface 251 is greater than the area of the bottom surface 253 and at least one side surface 255 is a surface inclined toward the top surface 141 of the light emitting device 140 or the top surface of the substrate 110, when the resin 260 is formed, the liquefied resin 260 can be prevented from moving to the top surface 251 of the wavelength conversion layer 250. Accordingly, it is possible to prevent the contamination or stain, which is caused by the resin 260, on the top surface 251 of the wavelength conversion layer 250.

Figure 7:
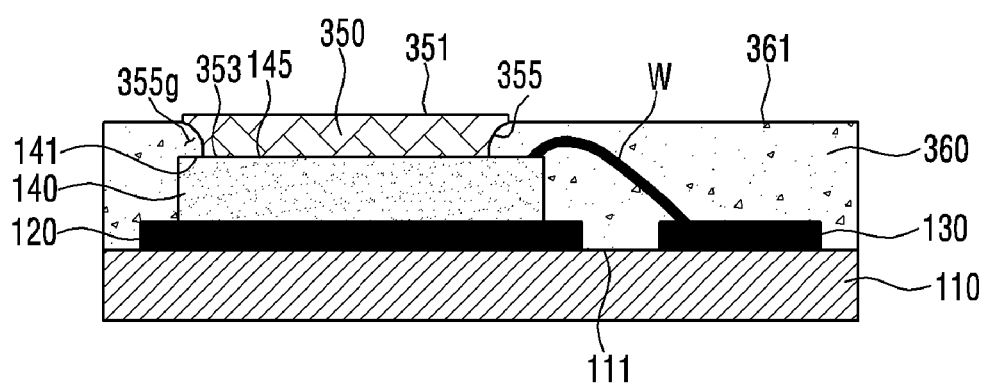
FIGS. 7 to 8 are cross sectional views showing a modified example of the lighting device shown in FIG. 4.
Figure 8:
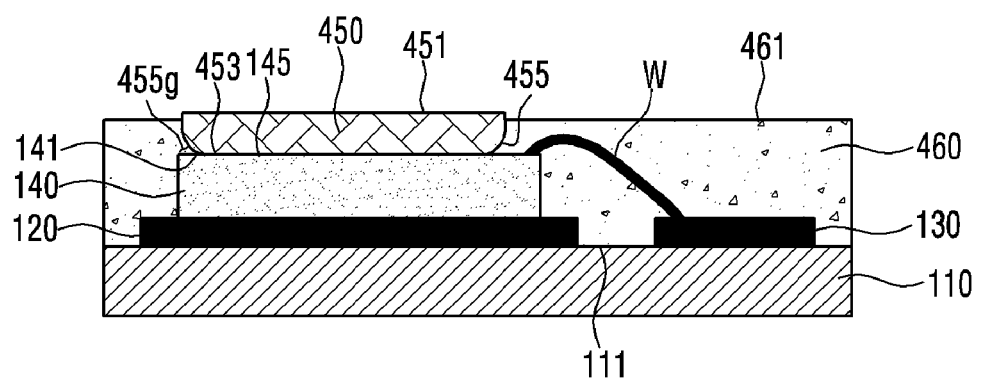

FIGS. 7 to 8 are cross sectional views showing a modified example of the lighting device shown in FIG. 4. Referring to FIGS. 7 to 8, the area of a top surface 351 and 451 of a wavelength conversion layer 350 and 450 may be greater than the area of a bottom surface 353 and 453. A side surface 355 and 455 may be a curved surface. The side surface 355 shown in FIG. 7 may be concave toward the inside of the wavelength conversion layer 350. The side surface 455 shown in FIG. 8 may be convex toward the outside of the wavelength conversion layer 450.

In the case where the area of the top surface 351 and 451 is greater than the area of the bottom surface 353 and 453 and the side surface 355 and 455 is a curved surface, when a resin 360 and 460 is formed, the liquefied resin 360 and 460 can be prevented from moving to the top surface 351 and 451 of the wavelength conversion layer 350 and 450. It is possible to prevent the contamination or stain, which is caused by the resin 360 and 460, on the top surface 351 and 451 of the wavelength conversion layer 350 and 450.

As shown in FIGS. 4 and 7 to 8, the side surfaces 255, 355 and 455 of the wavelength conversion layer 250, 350 and 450 of the lighting devices according to the first and the second embodiments of the present disclosure may have recesses 255g, 355g and 455g. The resins 260, 360 and 460 may be disposed in the recesses 255g, 355g and 455g. As such, in the case where the side surfaces 255, 355 and 455 of the wavelength conversion layer 250, 350 and 450 have the recesses 255g, 355g and 455g, when the resins 260, 360 and 460 are formed, the liquefied resins 260, 360 and 460 are formed, the liquefied resin 260, 360 and 460 can be prevented from moving to the top surface 251, 351 and 451 of the wavelength conversion layer 250, 350 and 450. It is possible to prevent the contamination or stain, which is caused by the resin 260, 360 and 460, on the top surface 251, 351 and 451 of the wavelength conversion layer 250, 350 and 450.

The recesses 255g, 355g and 455g may be disposed in the lower portion of the side surfaces 255, 355 and 455 of the wavelength conversion layer 250, 350 and 450. In the case where the recesses 255g, 355g and 455g are disposed in the lower portion of the side surfaces 255, 355 and 455 of the wavelength conversion layer 250, 350 and 450, when the resin 260, 360 and 460 are formed, it is more difficult for the resin 260, 360 and 460 to move to the top surface 251, 351 and 451 of the wavelength conversion layer 250, 350 and 450.

Figure 9:
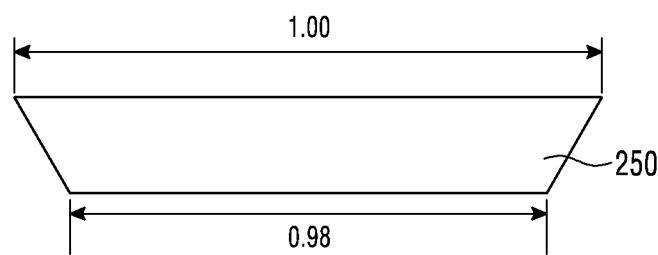
FIG. 9 is a view showing actual numerical values of the wavelength conversion layer 250 shown in FIG. 4.
Figure 9:
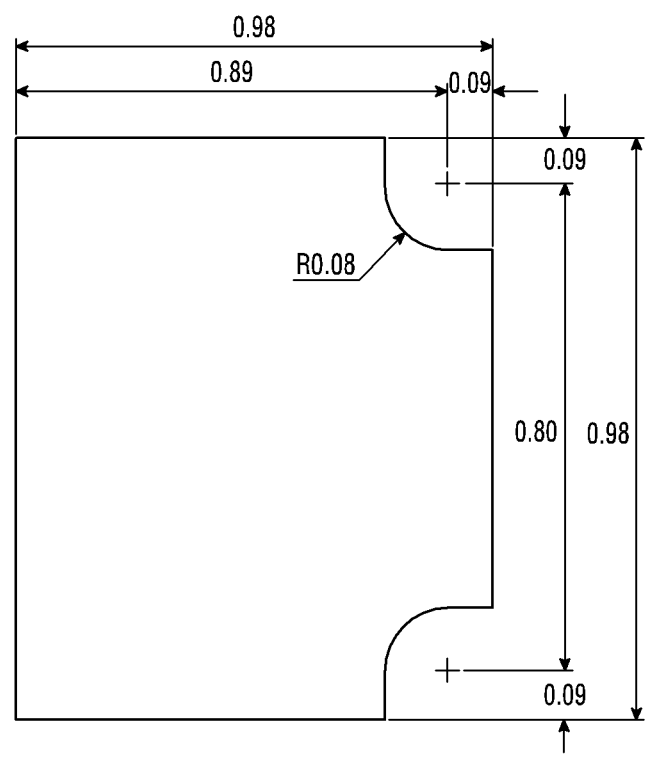

FIG. 9 is a view showing actual numerical values or ratios of the wavelength conversion layer 250 shown in FIG. 4. When the width of the top surface of the wavelength conversion layer 250 is set as 1, the width of the bottom surface 253 may be 0.98 and the horizon length and the vertical length of the bottom surface 253 may be the same as 0.98.

The width of the bottom surface 253 of the wavelength conversion layer 250 may be less than 0.98. The width of the bottom surface 253 may be changed depending on the thickness of the wavelength conversion layer 250, that is, a distance between the top surface 251 and the bottom surface 253. The thickness of the wavelength conversion layer 250 may be changed depending on a color temperature which the lighting device targets.

One embodiment is a lighting device which includes: a substrate; a light emitting device disposed on the substrate; a wavelength conversion layer which is disposed on the light emitting device and converts a part of first light emitted from the light emitting device into second light having a wavelength different from that of the first light; and a resin which is disposed on the substrate and buries the light emitting device and at least a portion of the wavelength conversion layer. The wavelength conversion layer comprises a bottom surface on which the first light is incident, a top surface through which the second light is emitted and a side surface between the bottom surface and the top surface. An area of the top surface of the wavelength conversion layer is greater than that of the bottom surface of the wavelength conversion layer. The side surface of the wavelength conversion layer is inclined at a predetermined angle with respect to the top surface or the bottom surface.

The angle between the side surface of the wavelength conversion layer and the bottom surface of the wavelength conversion layer may be an obtuse angle. The angle between the side surface of the wavelength conversion layer and the top surface of the wavelength conversion layer may be an acute angle.

The angle between the side surface of the wavelength conversion layer and the bottom surface of the wavelength conversion layer may be 95 degree to 115 degree. The angle between the side surface of the wavelength conversion layer and the top surface of the wavelength conversion layer may be from 65 degree to 85 degree.

The top surface of the wavelength conversion layer may include a fine uneven structure.

The resin may include a top surface. The top surface of the resin may be located lower than the top surface of the wavelength conversion layer.

The wavelength conversion layer may include a phosphor. The phosphor may include at least one of a red phosphor, a green phosphor, and a yellow phosphor.

The light emitting device may include a light emitting surface which emits the first light. An area of the bottom surface of the wavelength conversion layer may be greater than that of the light emitting surface of the light emitting device.

Another embodiment is a lighting device which includes: a substrate; a light emitting device disposed on the substrate; a wavelength conversion layer which is disposed on the light emitting device and converts a part of first light emitted from the light emitting device into second light having a wavelength different from that of the first light; and a resin which is disposed on the substrate and buries the light emitting device and at least a portion of the wavelength conversion layer. The wavelength conversion layer comprises a bottom surface on which the first light is incident, a top surface through which the second light is emitted and a side surface between the bottom surface and the top surface. An area of the top surface of the wavelength conversion layer is greater than that of the bottom surface of the wavelength conversion layer. The side surface of the wavelength conversion layer is a curved surface.

The side surface may be concave toward the inside of the wavelength conversion layer.

The side surface may be convex toward the outside of the wavelength conversion layer.

The top surface of the wavelength conversion layer comprises a fine uneven structure.

The resin may include a top surface. The top surface of the resin may be located lower than the top surface of the wavelength conversion layer.

The wavelength conversion layer may include a phosphor. The phosphor may include at least one of a red phosphor, a green phosphor, and a yellow phosphor.

The light emitting device may include a light emitting surface which emits the first light. An area of the bottom surface of the wavelength conversion layer may be greater than that of the light emitting surface of the light emitting device.

Further another embodiment is a lighting device which includes: a substrate; a light emitting device disposed on the substrate; a wavelength conversion layer which is disposed on the light emitting device and converts a part of first light emitted from the light emitting device into second light having a wavelength different from that of the first light; and a resin which is disposed on the substrate and buries the light emitting device and at least a portion of the wavelength conversion layer. The wavelength conversion layer comprises a bottom surface on which the first light is incident, a top surface through which the second light is emitted and a side surface between the bottom surface and the top surface. The side surface of the wavelength conversion layer comprises a recess in which the resin is disposed.

The side surface of the wavelength conversion layer may include an upper portion and a lower portion. The recess may be formed in the lower portion.

The top surface of the wavelength conversion layer may include a fine uneven structure.

The resin may include a top surface. The top surface of the resin may be located lower than the top surface of the wavelength conversion layer.

The wavelength conversion layer may include a phosphor. The phosphor may include at least one of a red phosphor, a green phosphor, and a yellow phosphor.

The light emitting device may include a light emitting surface which emits the first light. Area of the bottom surface of the wavelength conversion layer may be greater than that of the light emitting surface of the light emitting device.

It should be understood that when an element is referred to as being 'on' or "under" another element, it may be directly on/under the element, and/or one or more intervening elements may also be present. When an element is referred to as being 'on' or 'under', 'under the element' as well as 'on the element' may be included based on the element.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A lighting device comprising:
   a substrate;
   a light emitting device provided over the substrate;
   a wavelength conversion layer provided over the light emitting device and configured to convert at least a part of first light emitted from the light emitting device into second light having a wavelength different from that of the first light; and
   a resin provided over the substrate to cover the light emitting device and at least a portion of the wavelength conversion layer,
   wherein the wavelength conversion layer includes a bottom surface on which the first light is incident, a top surface through which the second light is emitted and a side surface between the bottom surface and the top surface,
   wherein an area of the top surface of the wavelength conversion layer is greater than that of the bottom surface of the wavelength conversion layer,
   wherein the side surface of the wavelength conversion layer is inclined at a predetermined angle with respect to the top surface or the bottom surface,
   wherein an area of the bottom surface of the wavelength conversion layer is less than an area of a top surface of the light emitting device,
   wherein the resin includes a top surface,
   wherein the top surface of the resin is located lower than the top surface of the wavelength conversion layer, and
   wherein the bottom surface of the wavelength conversion layer and the resin are in direct contact with the top surface of the light emitting device.

2. The lighting device of claim 1,
   wherein the angle between the side surface of the wavelength conversion layer and the bottom surface of the wavelength conversion layer is an obtuse angle,
   and wherein the angle between the side surface of the wavelength conversion layer and the top surface of the wavelength conversion layer is an acute angle.

3. The lighting device of claim 1,
   wherein the angle between the side surface of the wavelength conversion layer and the bottom surface of the wavelength conversion layer is 95 degree to 115 degree, and
   wherein the angle between the side surface of the wavelength conversion layer and the top surface of the wavelength conversion layer is from 65 degree to 85 degree.

4. The lighting device of claim 1, wherein the top surface of the wavelength conversion layer includes an uneven structure.

5. The lighting device of claim 1,
wherein the wavelength conversion layer includes a phosphor, and
wherein the phosphor comprises at least one of a red phosphor, a green phosphor, or a yellow phosphor.

6. The lighting device of claim 1,
wherein the light emitting device includes a light emitting surface which emits the first light, and
wherein an area of the bottom surface of the wavelength conversion layer is greater than that of the light emitting surface of the light emitting device.

7. The lighting device of claim 1,
wherein the side surface of the wavelength conversion layer includes a curved surface.

8. The lighting device of claim 7, wherein the side surface is concave toward the inside of the wavelength conversion layer.

9. The lighting device of claim 7, wherein the side surface is convex toward the outside of the wavelength conversion layer.

10. The lighting device of claim 7, wherein the top surface of the wavelength conversion layer includes an uneven structure.

11. The lighting device of claim 7,
wherein the wavelength conversion layer includes a phosphor, and
wherein the phosphor comprises at least one of a red phosphor, a green phosphor, or a yellow phosphor.

12. The lighting device of claim 7,
wherein the light emitting device includes a light emitting surface which emits the first light, and
wherein an area of the bottom surface of the wavelength conversion layer is greater than that of the light emitting surface of the light emitting device.

13. The lighting device of claim 1,
wherein the side surface of the wavelength conversion layer includes a recess in which the resin is disposed.

14. The lighting device of claim 13,
wherein the side surface of the wavelength conversion layer includes an upper portion and a lower portion, and
wherein the recess is formed in the lower portion.

15. The lighting device of claim 13, wherein the top surface of the wavelength conversion layer includes an uneven structure.

16. The lighting device of claim 13,
wherein the wavelength conversion layer includes a phosphor, and
wherein the phosphor comprises at least one of a red phosphor, a green phosphor, or a yellow phosphor.

17. The lighting device of claim 13,
wherein the light emitting device includes a light emitting surface which emits the first light, and
wherein an area of the bottom surface of the wavelength conversion layer is greater than that of the light emitting surface of the light emitting device.

* * * * *